(12) United States Patent
Suh et al.

(10) Patent No.: US 7,151,696 B2
(45) Date of Patent: Dec. 19, 2006

(54) INTEGRATED CIRCUIT MEMORY DEVICES HAVING HIERARCHICAL BIT LINE SELECTION CIRCUITS THEREIN

(75) Inventors: Young-Ho Suh, Gyeonggi-do (KR); Hyun-Geun Byun, Gyeonggi-do (KR)

(73) Assignee: Samsung Electronics Co., Ltd. (KR)

(*) Notice: Subject to any disclaimer, the term of this patent is extended or adjusted under 35 U.S.C. 154(b) by 37 days.

(21) Appl. No.: 11/041,675

(22) Filed: Jan. 24, 2005

(65) Prior Publication Data

US 2006/0062061 A1 Mar. 23, 2006

(30) Foreign Application Priority Data

Sep. 20, 2004 (KR) .................. 10-2004-0075252

(51) Int. Cl.
*G11C 11/34* (2006.01)
(52) U.S. Cl. ............ 365/185.25; 365/188; 365/189.11; 365/190
(58) Field of Classification Search ........... 365/185.25, 365/188, 189.11, 190
See application file for complete search history.

(56) References Cited

U.S. PATENT DOCUMENTS

| | | | |
|---|---|---|---|
| 4,637,127 A | | 1/1987 | Kurogi et al. |
| 5,058,067 A | * | 10/1991 | Kertis .................. 365/190 |
| 5,544,105 A | * | 8/1996 | Hirose et al. .......... 365/189.11 |
| 5,715,189 A | | 2/1998 | Asakura |
| 5,815,428 A | | 9/1998 | Tsuruda et al. |
| 5,848,012 A | | 12/1998 | Tsukude et al. |
| 5,875,139 A | | 2/1999 | Semi et al. |
| 5,917,744 A | | 6/1999 | Kirihata et al. |
| 6,021,072 A | | 2/2000 | Takeda et al. |
| 6,195,280 B1 | | 2/2001 | Lattimore |
| 6,990,002 B1 | * | 1/2006 | Mizuno et al. .......... 365/63 |

FOREIGN PATENT DOCUMENTS

JP 60-113452 A2 6/1985

OTHER PUBLICATIONS

Karandikar et al., "Low Power SRAM Design Using Hierarchical Divided Bit-Line Approach," ICCD Proceedings, Oct. 1998, pp. 82-88.
Jung et al., "The Revolutionary and Truly 3-Dimensional $25F^2$ SRAM Technology with the smallest $S^3$ (Stacked Single-crystal Si) Cell, $0.16um^2$, and SSTFT (Stacked Single-crystal Thin Film Transistor) for Ultra High Density SRAM," Symposium on VLSI Technology Digest, Jun. 2004, pp. 228-229.
Jung et al., "Highly area efficient and cost effective double stacked $S^3$ (Stacked Single-cyrstal Si) Peripheral CMOS SSTFT and SRAM Cell Technology for 512M bit density SRAM," Electron Devices Meeting, 2004, IEDM Technical Digest, IEEE International San Francisco, CA, Dec. 13-15, 2004, pp. 265-268.
Suh et al., "A 256mb synchronous-burst 1-12 DDR SRAM with hierarchical bit-line architecture for mobile applications," Solid-State Circuits Conference, 2005, Digest of Technical Papers, IEEE International San Francisco, CA, Feb. 6-10, 2005, pp. 476-478.
European Search Report, European Application No. 05091824.1, Aug. 16, 2006.

* cited by examiner

*Primary Examiner*—Tuan T. Nguyen
(74) *Attorney, Agent, or Firm*—Myers Bigel Sibley & Sajovec PA

(57) ABSTRACT

Integrated circuit memory devices include a first column of memory cells electrically coupled to a first pair of bit lines and a bit line precharge and selection circuit. This bit line precharge and selection circuit includes at least one stacked arrangement of thin-film transistors. These thin-film transistors include a first PMOS thin-film pull-up transistor and a first NMOS thin-film pass transistor. These thin-film transistors are electrically coupled to one of the first pair of bit lines. The first column of memory cells includes a column of TFT SRAM cells.

22 Claims, 8 Drawing Sheets

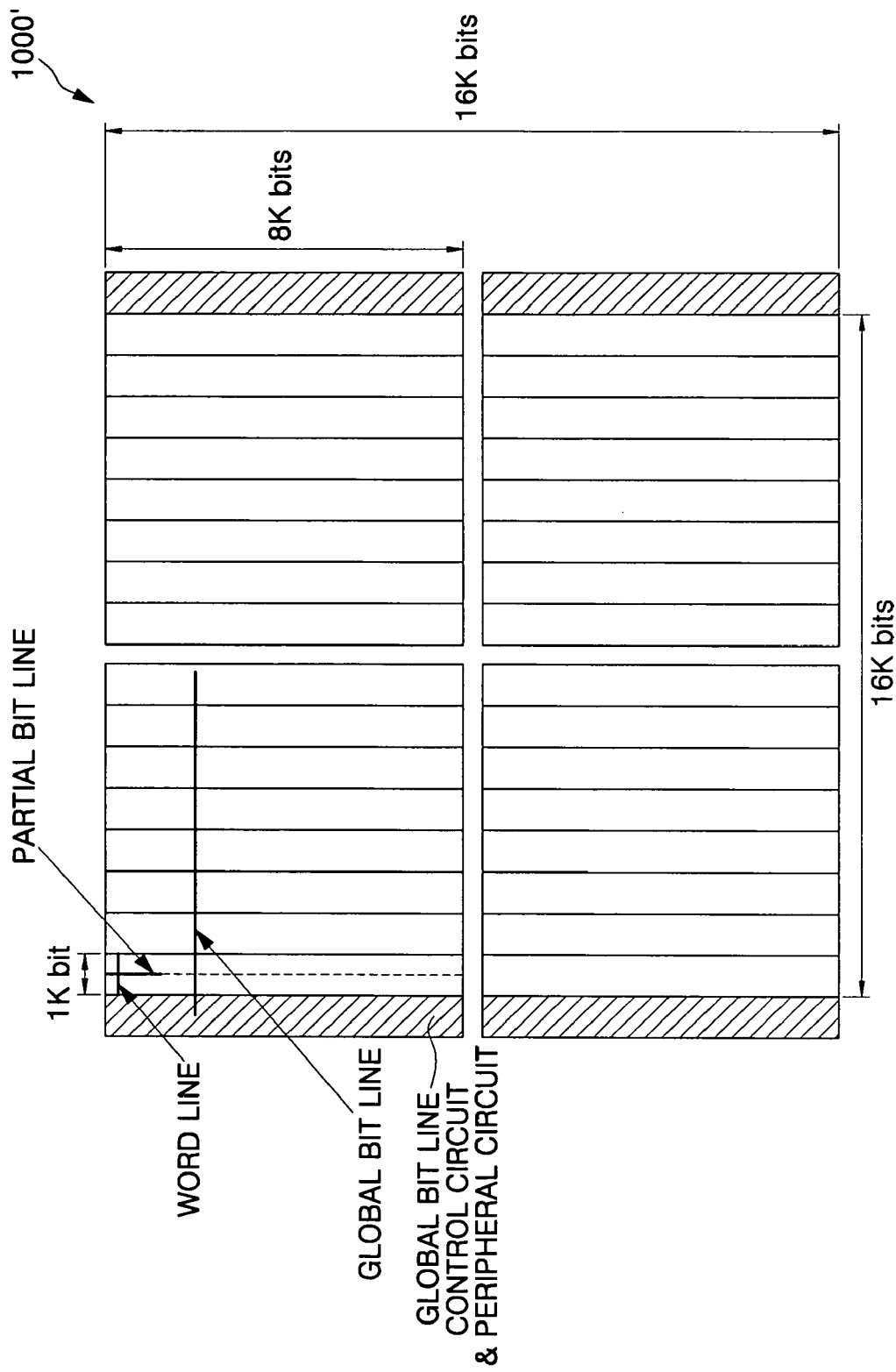

INTEGRATED CIRCUIT MEMORY DEVICES HAVING HIERARCHICAL BIT LINE SELECTION CIRCUITS THEREIN

REFERENCE TO PRIORITY APPLICATION

This application claims priority to Korean Application Serial No. 2004-75252, filed Sep. 20, 2004, the disclosure of which is hereby incorporated herein by reference.

FIELD OF THE INVENTION

The present invention relates to integrated circuit devices and methods of operating same and, more particularly, to integrated circuit memory devices and methods of operating same.

BACKGROUND OF THE INVENTION

Conventional memory devices include a class of memory devices referred to as static random access memory (SRAM) devices. As illustrated by FIG. 1, a conventional SRAM device 100 includes a plurality of column units 101 arranged side-by-side in a semiconductor substrate. Each of the column units 101 is illustrated as including a column of SRAM cells 107, a bit line precharging and equalization circuit 109, which is responsive to an active low bit line precharge signal /PBL, and a bit line selection circuit 111, which is responsive to a pair of column selection signals Y and /Y. The column of SRAM cells 107 is electrically coupled to a corresponding pair of bit lines (BL and /BL) and each SRAM cell within the column 107 is responsive to a corresponding word line signal (SWL1–SWLn). The bit line precharging and equalization circuit 109 includes PMOS transistors P1–P3 and the bit line selection circuit 111 includes transmission gates TG1 and TG2. As will be understood by those skilled in the art, setting the bit line precharge signal /PBL low during a precharge time interval causes both bit lines BL and /BL to be equalized at a logic 1 voltage level (e.g., Vdd). In addition, setting the bit line precharge signal /PBL high and the true column selection signal Y high (and /Y low) will cause the pair of bit lines BL and /BL to be connected to a pair of data lines DL and /DL. During a read operation, these data lines DL and /DL provide read data to a sense amplifier 103 and a data output buffer 113 within a read path of the memory device. During a write operation, the data lines DL and /DL receive write data from a write driver 105, which is electrically coupled to a data input buffer 115.

As illustrated by the timing diagram of FIG. 2, a leading edge of a clock signal CLK (for a synchronous SRAM device) or an address ADD (for an asynchronous SRAM device) may result in the switching of the word line, column selection and bit line precharge signals illustrated by FIG. 1. In particular, prior to receipt of a leading edge of the clock signal CLK (or address ADD), the bit line precharge signal /PBL is held low and the pair of bit lines BL and /BL are held high at logic 1 voltage levels. Then, upon receipt of the leading edge, the bit line precharge signal /PBL is switched high to an inactive level, a selected word line SWL1 is switched high to activate a row of SRAM cells and the column selection signals Y and /Y are set high and low, respectively, to thereby electrically couple the pair of bit lines BL and /BL to the corresponding pair of data lines DL and /DL. These switching operations result in a transfer of differential read data from a selected memory cell to the corresponding bit lines BL and /BL and then to the corresponding data lines DL and /DL. This differential read data is then detected and amplified by the sense amplifier 103 and output to the data output buffer 113.

A possible layout of the SRAM device 100 of FIG. 1 is illustrated by FIG. 3. In particular, FIG. 3 illustrates an SRAM device having a capacity of 16K bits by 16K bits, with each sub-block of 1K bits by 2K bits worth of memory being arranged as 2048 rows of SRAM cells extending in a horizontal word line direction by 1024 columns of SRAM cells extending in a vertical bit line direction. Each sub-block is associated with a corresponding bit line control circuit and peripheral circuit. Unfortunately, the bit line capacitance associated with each pair of bit lines (BL and /BL), which span 2048 rows of SRAM cells, may be excessive and thereby increase active power (i.e., switching power) and access time during reading and writing operations.

To address these problems of excessive active power and access time, integrated circuit memory devices may utilize hierarchical bit line selection circuits that reduce bit line capacitance. In some of these memory devices, two or more SRAM cells may be used in combination to divide a bit line into two or more sub bit-lines, which are combined to form two or more levels of hierarchy. One such memory device is disclosed in an article by A. Karandikar et al., entitled "Low Power SRAM Design Using Hierarchical Divided Bit-Line Approach," ICCD Proceedings, pp. 82–88, October 1998. In particular, the Karandikar et al. article illustrates how the drain capacitance loading on a bit line can be reduced by reducing the number of access transistors connected to the bit line by a factor of four or more. However, this advantageous reduction in bit line capacitance typically incurs a layout area penalty because additional column decoding and related circuits are required to control the additional access transistors at the multiple levels of hierarchy. U.S. Pat. No. 5,715,189 to Asakura also discloses a memory device having a hierarchical bit line arrangement.

Conventional techniques to achieve reductions in layout area of SRAM memory devices are disclosed in an article by S. M. Jung et al., entitled "The Revolutionary and Truly 3-Dimensional 25F$^2$ SRAM Technology with the Smallest S$^3$ (Stacked Single-Crystal Si) Cell, 0.16 um$^2$, and SSTFT (Stacked Single-crystal Thin Film Transistor) for Ultra High Density SRAM," Symposium on VLSI Technology Digest, pp. 228–229, June 2004, the disclosure of which is hereby incorporated herein by reference. In this article, an SRAM cell having a reduced cell size is described as having two thin-film PMOS load transistors and two thin-film NMOS pass transistors stacked over two planar NMOS pull-down transistors. In particular, FIG. 3 of this article shows a 6T SRAM cell having a pair of NMOS bulk transistors, a pair of PMOS load transistors on an interlayer dielectric layer (ILD1) and a pair of NMOS access transistors on another interlayer dielectric layer (ILD2).

SUMMARY OF THE INVENTION

Integrated circuit memory devices according to embodiments of the invention utilize hierarchical bit line selection circuits to reduce active power requirements by lowering bit line capacitance. These memory devices also include arrangements of stacked thin-film transistors (TFTs), which reduce the layout area requirements of bit line precharge and selection circuits. According to some of these embodiments of the invention, a memory device includes at least a first column of memory cells electrically coupled to a first pair of bit lines. A bit line precharge and selection circuit is also provided. This bit line precharge and selection circuit includes a stacked arrangement of a first PMOS pull-up transistor and a first NMOS pass transistor electrically coupled to one of the first pair of bit lines. This stacked arrangement of transistors may be disposed above a memory core portion of a semiconductor substrate and thereby reduce the presence of alternating P-type and N-type conductivity regions within the memory core portion. This reduction in alternating P-type and N-type conductivity regions operates to inhibit an occurrence of parasitic latch-up, which may result in potentially destructive regenerative current conduction within the substrate.

According to preferred aspects of these embodiments, the first PMOS pull-up transistor is a PMOS TFT and the first NMOS pass transistor is an NMOS TFT. The first current carrying terminal of the PMOS TFT is electrically connected to a first current carrying terminal of the NMOS TFT and a true one of the first pair of bit lines. A gate terminal of the PMOS TFT is electrically connected to a gate terminal of the NMOS TFT. A second current carrying terminal of the PMOS TFT is electrically connected to a power supply line (Vdd) and a second current carrying terminal of the NMOS TFT is electrically connected to a global bit line.

Other embodiments of the invention include an integrated circuit memory device having at least first and second columns of memory cells therein, which are electrically coupled to first and second pairs of bit lines, respectively, and a first bit line precharge and selection circuit. This first bit line precharge and selection circuit includes a stacked arrangement of a first PMOS TFT and a first NMOS TFT electrically coupled to a true one of the first pair of bit lines and a stacked arrangement of a second PMOS TFT and a second NMOS TFT electrically coupled to a complementary one of the first pair of bit lines. A pair of global bit lines is electrically coupled to the first and second NMOS TFTs. The memory device also includes a pair of data lines and a precharge and equalization circuit electrically coupled to the pair of global bit lines. In addition, a global bit line selection circuit is provided, which is electrically coupled to the precharge and equalization circuit and the pair of data lines.

Still further embodiments of the invention include a first column of TFT SRAM cells electrically coupled to a first pair of bit lines. These TFT SRAM cells may include two thin-film PMOS load transistors and two thin-film NMOS pass/access transistors stacked over two planar NMOS pull-down transistors, which are disposed within a semiconductor substrate. A bit line precharge and selection circuit is provided. This circuit includes a stacked arrangement of a first PMOS TFT and a first NMOS TFT electrically coupled to one of the first pair of bit lines. A first current carrying terminal (e.g., drain) of the PMOS TFT is electrically connected to a first current carrying terminal of the NMOS TFT and a true one of the first pair of bit lines. A gate terminal of the PMOS TFT is electrically connected to a gate terminal of the NMOS TFT. A second current carrying terminal (e.g., source) of the PMOS TFT is electrically connected to a power supply line and a second current carrying terminal of the NMOS TFT is electrically connected to a global bit line.

BRIEF DESCRIPTION OF THE DRAWINGS

FIG. 7A is a block diagram of a 16K by 16K memory device according to embodiments of the present invention.

DESCRIPTION OF PREFERRED EMBODIMENTS

Figure 1:
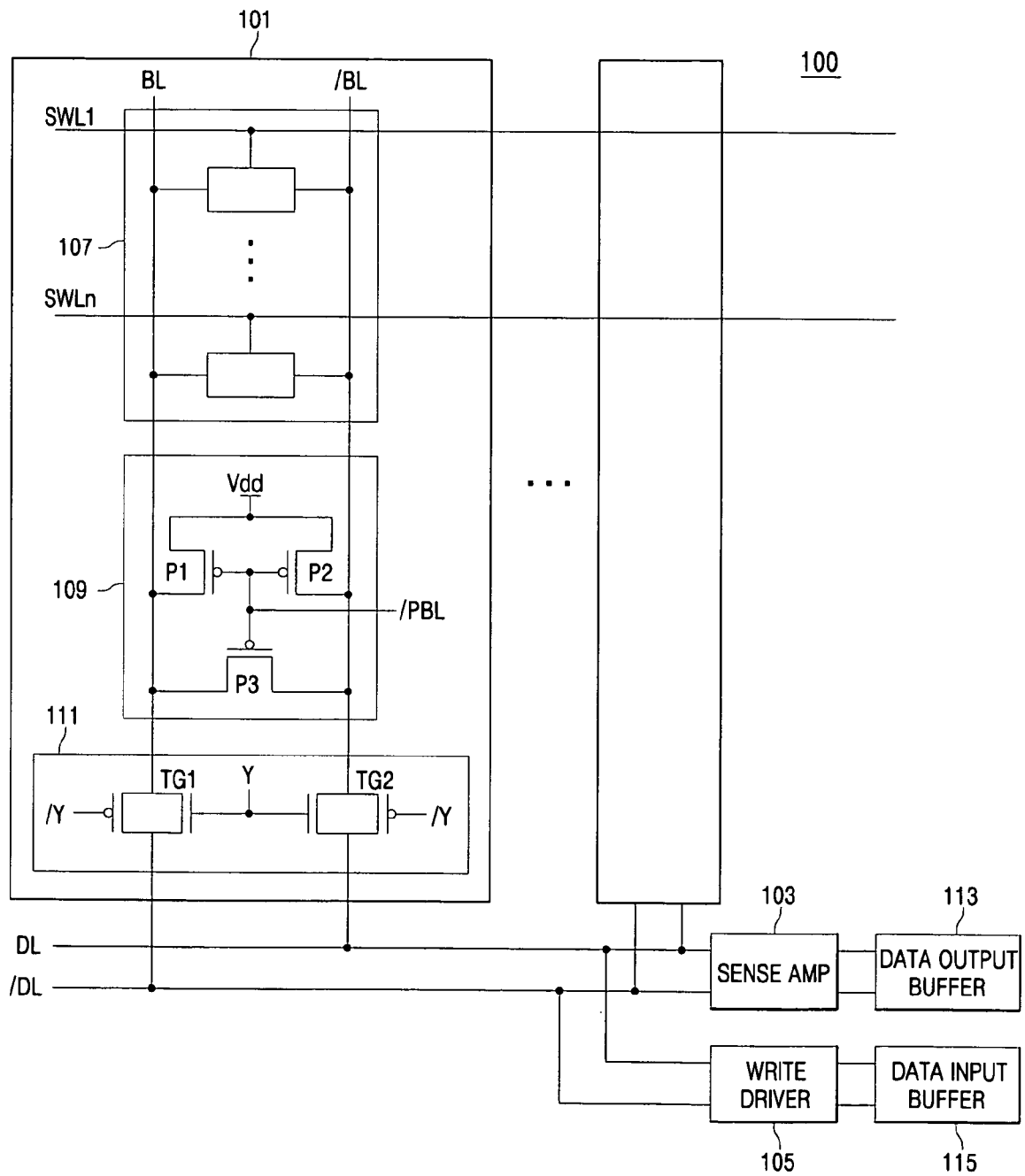
FIG. 1 is an electrical schematic of a conventional SRAM device.
Figure 2:
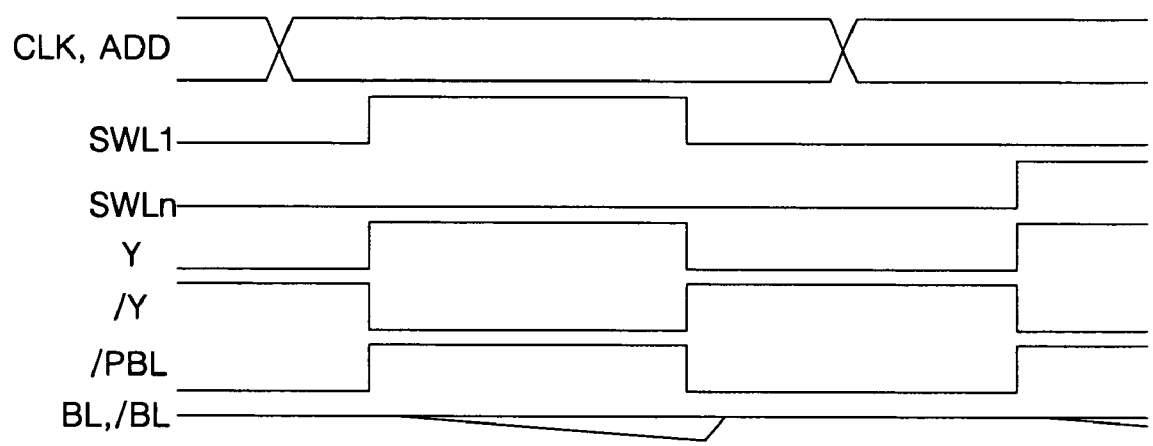
FIG. 2 is a timing diagram that illustrates operation of the SRAM device of FIG. 1.
Figure 3:
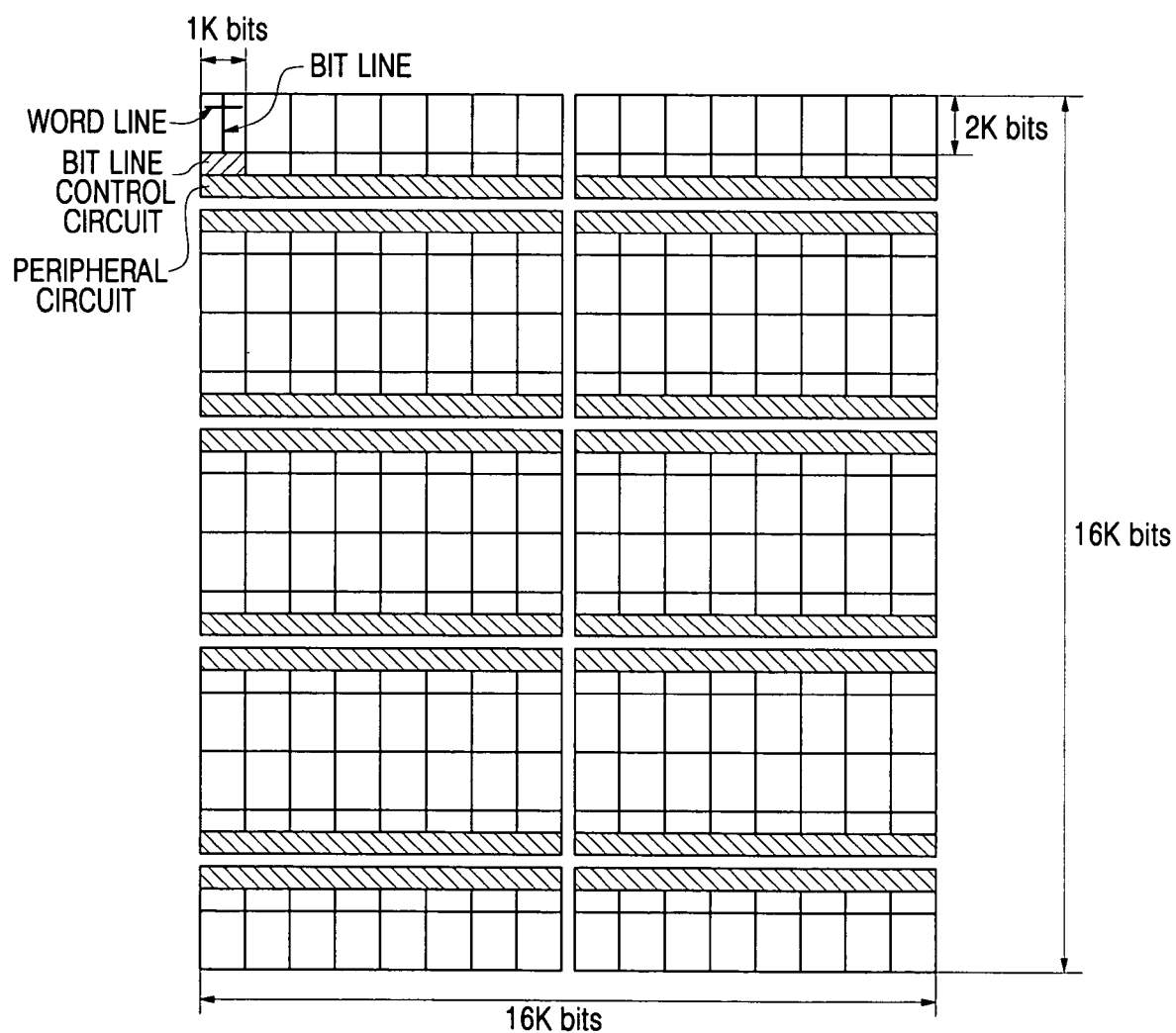
FIG. 3 is a block diagram of a 16K by 16K conventional SRAM device.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. In the drawings, the thickness of layers and regions are exaggerated for clarity of description. It will also be understood that when a layer is referred to as being "on" another layer or substrate, it can be directly on the other layer or substrate, or intervening layers may also be present. Like reference numerals refer to like elements throughout. Signals may also be synchronized and/or undergo minor boolean operations (e.g., inversion) without being considered different signals. The suffix B (or prefix symbol "/") to a signal name may also denote a complementary data or information signal or an active low control signal, for example.

Figure 4:
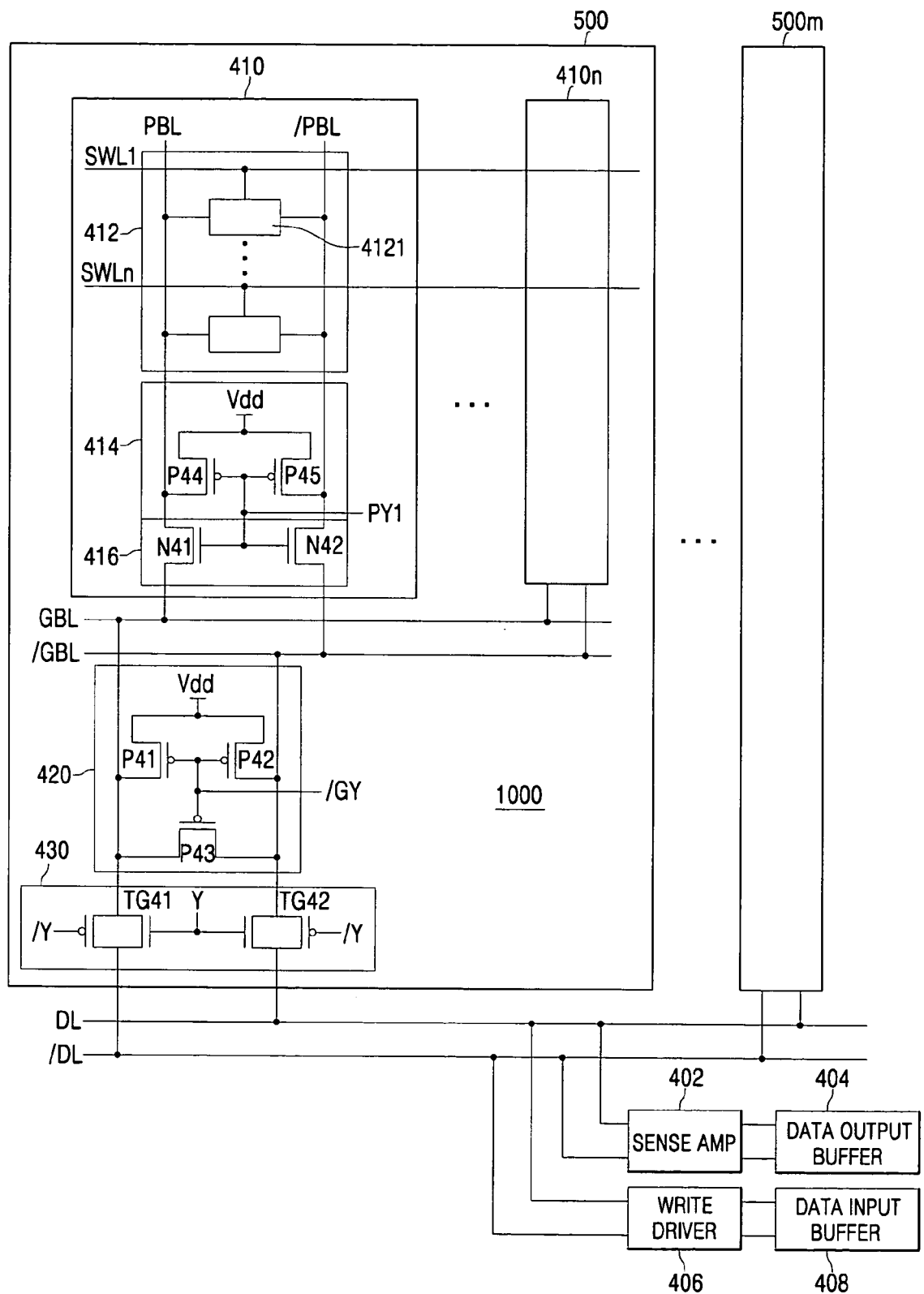
FIG. 4 is an electrical schematic of an integrated circuit memory device according to embodiments of the present invention.

Referring now to FIG. 4, an integrated circuit memory device 1000 according to an embodiment of the present invention includes a plurality of equivalent global column units 500–500m connected to a pair of differential data lines DL and /DL. Data provided to the data lines DL and /DL during read operations is sensed and amplified by a sense amplifier 402 and passed to a data output buffer 404. During write operations, write data is received by a data input buffer 408 and then passed to a write driver 406, which drives the data lines DL and /DL. Each of the global column units includes a plurality of partial column units 410–410n connected to a pair of global bit lines GBL and /GBL. The first partial column unit 410 includes a column 412 of SRAM memory cells 4121 coupled to a pair of partial bit lines PBL and /PBL. This column 412 of SRAM memory cells 4121 is illustrated as including 1 to n rows of SRAM memory cells 4121, which are electrically coupled to respective ones of the word lines SWL1-SWLn. These SRAM memory cells 4121 may be thin-film transistor (TFT) SRAM cells, which utilize an arrangement of thin-film transistors stacked on top of planar transistors. In particular, each of these TFT SRAM cells may be a 6T cell including two TFT P-type pull-up transistors and two TFT N-type access transistors stacked over two planar field effect transistors, which are disposed within a semiconductor substrate. An exemplary embodiment of a six transistor (6T) TFT SRAM cell is disclosed in the aforementioned S. M. Jung article, which is hereby incorporated herein by reference. The pair of partial bit lines PBL and /PBL electrically couples the column 412 of SRAM memory cells 4121 to a partial bit line precharging circuit 414 and a partial bit line selection circuit 416. The partial bit line precharging circuit 414 is illustrated as including a pair of PMOS pull-up transistors P44 and P45 and the partial bit line selection circuit 416 is illustrated as including a pair of NMOS pass transistors N41 and N42. The gate terminals of these transistors N41, N42, P44 and P45 are connected to a partial column selection line PY1. When the partial column selection line PY1 is switched high-to-low during a precharge time interval, the pair of partial bit lines PBL and /PBL are precharged to a logic 1 voltage level (e.g., Vdd). However, when the partial column selection line PY1 is switched low-to-high, the NMOS pass transistors N41 and N42 are turned on to thereby electrically connect the partial bit lines PBL and /PBL to the global bit lines GBL and /GBL. The low-to-high switching of the partial column selection line PY1 preferably includes driving the partial column selection line PY1 to a boosted voltage level Vpp. The value of this boosted voltage level Vpp may equal a sum of the power supply voltage Vdd (e.g., 1.2 Volts) and Vth (e.g., 0.6 Volts), where Vth equals a threshold voltage of the NMOS pass transistors N41 and N42. Driving the partial column selection line PY1 to a boosted voltage level Vpp enables each of the global bit lines GBL and /GBL to support a full rail logic 1 voltage during read operations and enables each of the partial bit lines PBL and /PBL to support a full rail logic 1 voltage during write operations.

The data path associated with the global column unit 500 also includes a global bit line precharging and equalizing circuit 420 and a global bit line selection circuit 430. The global bit line precharging and equalizing circuit 420 includes PMOS pull-up transistors P41 and P42 and a PMOS equalizing transistor P43. The source terminals of the PMOS pull-up transistors P41 and P42 are electrically connected to a power supply line Vdd and the drain terminals of the PMOS pull-up transistors P41 and P42 are electrically connected to the global bit lines GBL and /GBL. The source and drain terminals of the PMOS equalizing transistor P43 are also electrically connected to the drain terminals of the PMOS pull-up transistors P41 and P42. The gate terminals of the PMOS transistors P41–P43 are responsive to an active low global column selection signal /GY. The global bit line selection circuit 430 includes a pair of transmission gates TG41 and TG42, which are electrically coupled to the pair of data lines DL and /DL. These transmission gates are responsive to the column selection signals Y and /Y.

Figure 5:
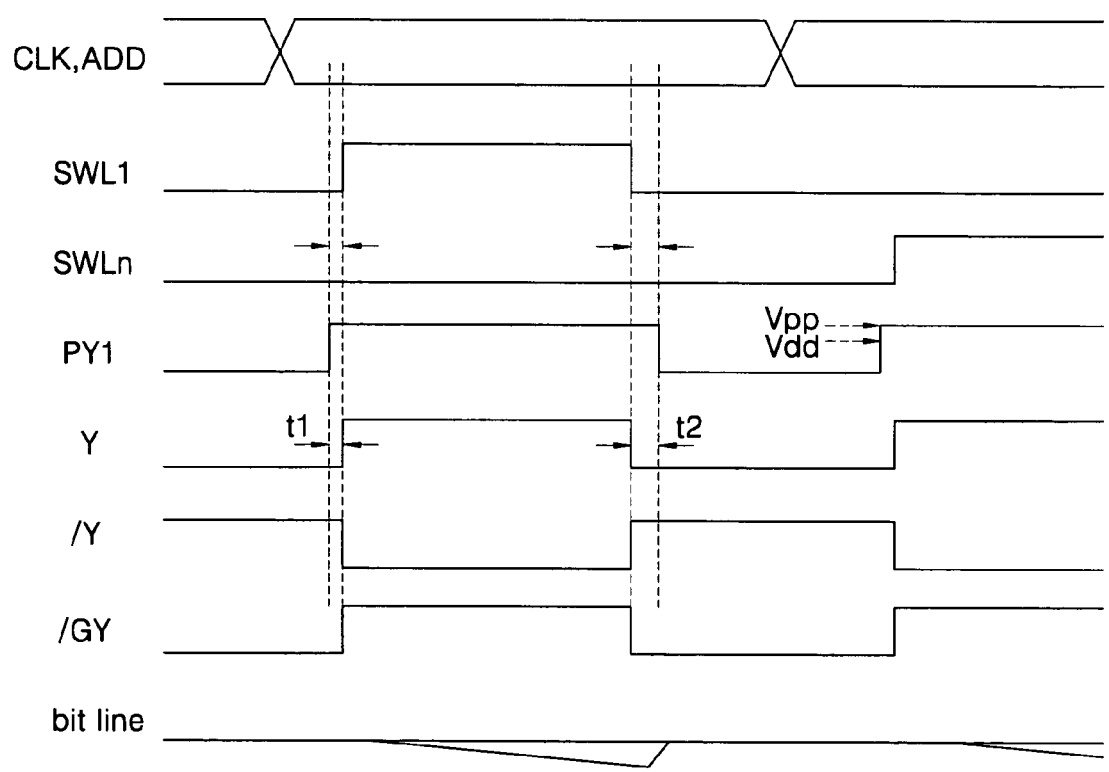
FIG. 5 is a timing diagram that illustrates operation of the memory device of FIG. 4.

As illustrated by FIG. 5, operation of the global column unit 500 of FIG. 4 may be synchronized with a clock signal CLK (for a synchronous SRAM device) or an address ADD (for an asynchronous SRAM device). In advance of a leading edge of the clock signal CLK (or address ADD), the pair of partial bit lines PBL and /PBL and the pair of global bit lines GBL and /GBL may be precharged to logic 1 voltage levels by switching the partial column selection line PY1 low and also switching the global column selection signal /GY low. Thereafter, in response to the leading edge of the clock signal CLK (or address ADD), the partial column selection line PY1 is switched high to the boosted voltage level (e.g., PY1=Vpp) to thereby electrically connect the pair of partial bit lines PBL and /PBL to the pair of global bit lines GBL and /GBL and terminate the precharging operation. After a time interval of t1, the word line (e.g., SWL1) for an addressed row of SRAM cells is driven high (e.g., 1.5 Volts) so that data within the selected SRAM cell 4121 is passed to the corresponding pair of partial bit lines PBL and /PBL. The global column selection signal line /GY and the true column selection signal Y are also switched low-to-high (e.g., /GY=Y=Vdd) to terminate precharging of the pair of global bit lines GBL and /GBL and enable data on the pair of partial bit lines PBL and /PBL to be passed to the pair of global bit lines GBL and /GBL and to the pair of data lines DL and /DL. This read data is then sensed and amplified as a rail-to-rail signal by the sense amplifier 402.

After a sufficient amount of time, the selected word line SWL1, the true column selection signal Y and the global column selection signal line /GY are switched high-to-low. This causes the global bit lines GBL and /GBL to be precharged and disconnected from the pair of data lines DL and /DL. Then, after a time interval of t2, the partial column selection signal line PY1 is switched high-to-low to again precharge the partial bit lines PBL and /PBL. The above-described read operations may then be repeated for another row of memory cells 4121.

Figure 7B:
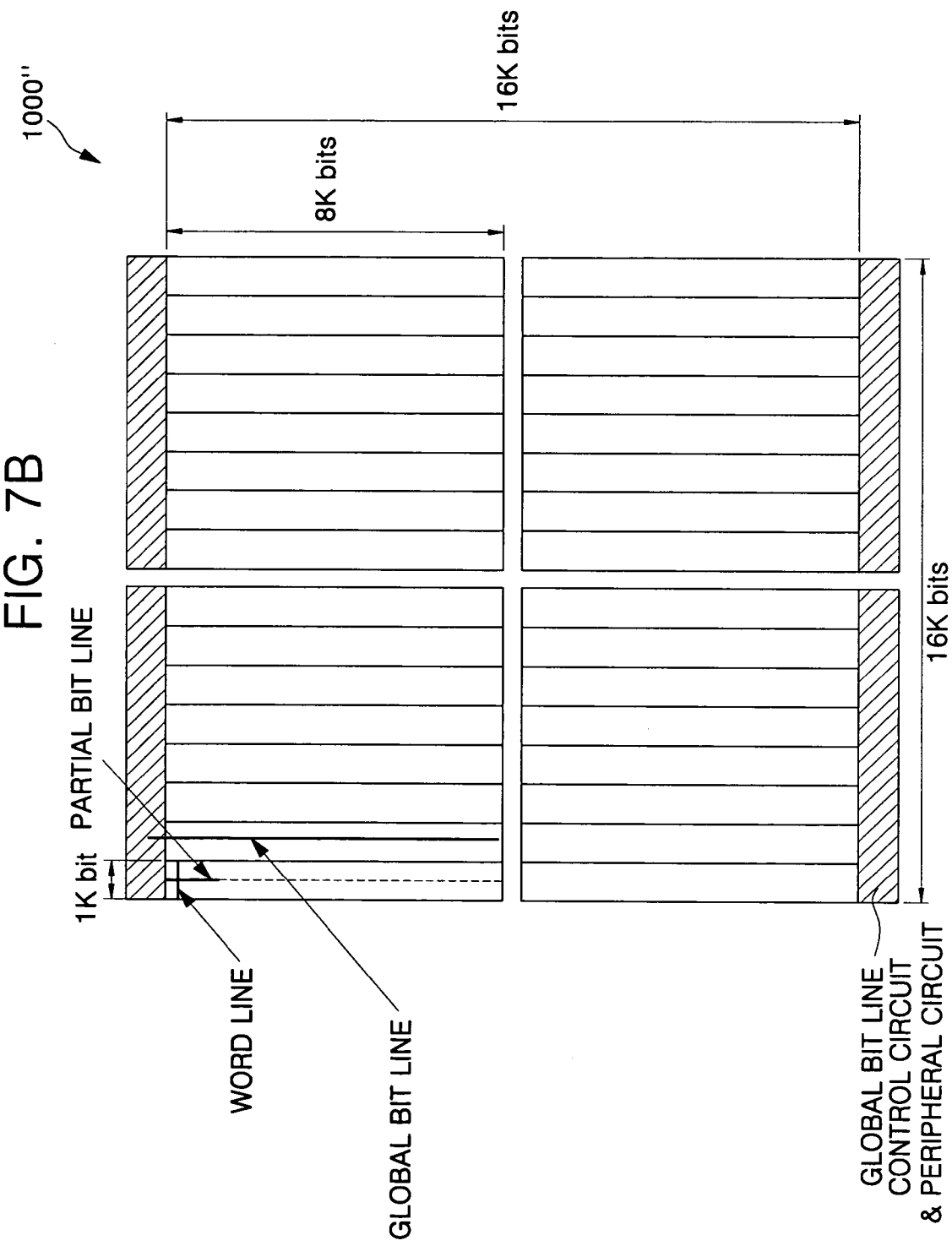
FIG. 7B is a block diagram of another 16K by 16K memory device according to embodiments of the present invention.

One 16k by 16k embodiment of the memory device 1000 of FIG. 4 is illustrated by FIG. 7A. This memory device 1000' of FIG. 7A is arranged into four 8k by 8k quadrants. Each of these quadrants includes eight 1k bit global column units. As illustrated, the word lines (SWLn) and the global bit lines (GBL and /GBL) extend parallel to each other, but in an orthogonal direction relative to the partial bit lines (PBL and /PBL). The shaded regions illustrate a global bit line control circuit and peripheral circuit. The global bit line control circuit includes the global bit line precharging and equalizing circuits 420 and the global bit line selection circuits 430 illustrated by FIG. 4. Another 16k by 16k embodiment of the memory device 1000 of FIG. 4 is illustrated by FIG. 7B. This memory device 1000" of FIG. 7B is arranged into four 8k by 8k quadrants. Each of these quadrants includes eight 1k bit global column units. As illustrated, the word lines (SWLn) and the global bit lines (GBL and /GBL) are orthogonal to each other, and the global bit lines and the partial bit lines (PBL and /PBL) are parallel to each other. The shaded regions illustrate a global bit line control circuit and peripheral circuit. The global bit line control circuit includes the global bit line precharging and equalizing circuits 420 and the global bit line selection circuits 430 illustrated by FIG. 4.

Figure 6:
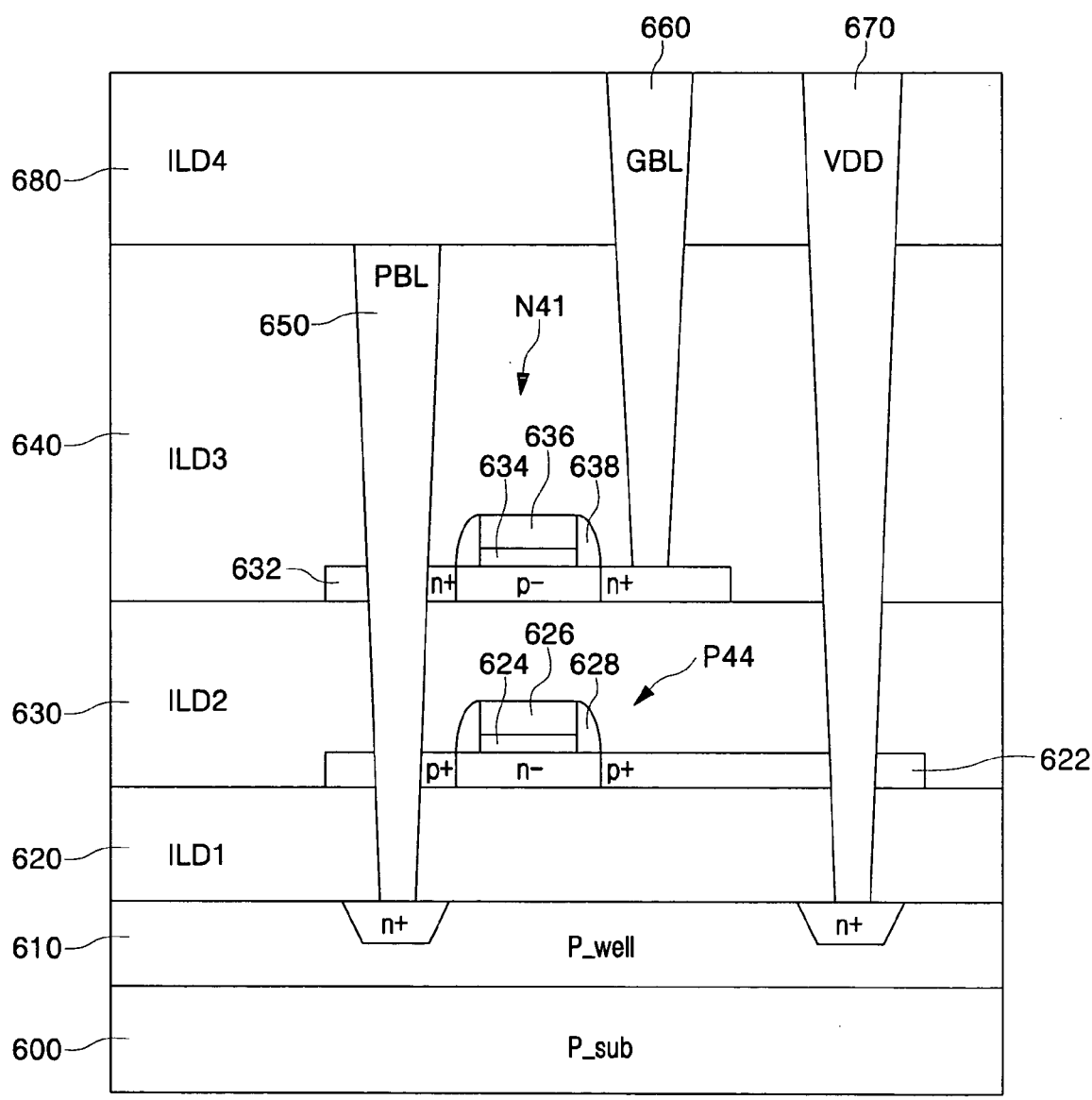
FIG. 6 is a cross-sectional view of a stacked thin-film transistor structure according to embodiments of the present invention.

As illustrated by FIG. 6, the PMOS pull-up transistor P44 and the NMOS pass transistor N41 of FIG. 4 may be configured as thin-film transistors (TFTs), which are stacked vertically on a semiconductor substrate 600 (e.g., P-type substrate). Although not shown, the PMOS pull-up transistor P45 and the NMOS pass transistor N42 may also be configured as stacked thin-film transistors (TFTs) that are disposed side-by-side relative to the stacked transistors illustrated by FIG. 6. Accordingly, all the transistors within the partial bit line precharging circuit 414 and the partial bit line selection circuit 416 of FIG. 4 may be formed as a closely stacked arrangement of two pairs of single-crystal TFTs. The formation of these TFT transistors above the substrate 600 may eliminate a need to form alternating P-type and N-type conductivity regions within a portion of the substrate and thereby inhibit any occurrence of parasitic latch-up, which may result in regenerative current conduction within the substrate 600.

In FIG. 6, a P-type well region 610 is shown as being disposed within the semiconductor substrate 600. A plurality of interlayer dielectric layers are also provided on the substrate 600. These dielectric layers include a first interlayer dielectric layer 620 (ILD1), a second interlayer dielectric layer 630 (ILD2), a third interlayer dielectric layer 640 (ILD3) and a fourth interlayer dielectric layer 680 (ILD4). The PMOS pull-up transistor P44 is defined by a single crystal silicon active layer 622 having source, drain and channel regions therein. This single crystal silicon active layer 622 is shown as being directly on the first interlayer insulating layer 620. A gate electrode of the PMOS pull-up transistor P44 includes a gate insulating pattern 624, a gate pattern 626 and sidewall spacers 628. The NMOS pass transistor N41 is defined by a single crystal silicon active layer 632 having source, drain and channel regions therein. This single crystal silicon active layer 632 is shown as being directly on the second interlayer insulating layer 630 and stacked above the PMOS pull-up transistor P44. A gate electrode of the NMOS pass transistor N41 includes a gate insulating pattern 634, a gate pattern 636 and sidewall spacers 638.

A contact to the drain of the PMOS pull-up transistor P44 and a first current carrying terminal of the NMOS pass transistor N41 is provided by a partial bit line conductive via 650, which is electrically connected to a partial bit line PBL (not shown in FIG. 6). A contact to the source of the PMOS pull-up transistor P44 is provided by a power supply line conductive via 670, which is electrically connected to a power supply line Vdd (not shown in FIG. 6). A contact to a second current carrying terminal of the NMOS pass transistor N41 is provided by a global bit line conductive via 660, which is electrically connected to a global bit line GBL (not shown in FIG. 6).

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:
a first column of memory cells electrically coupled to a first pair of bit lines; and
a bit line precharge and selection circuit comprising a stacked arrangement of a first PMOS pull-up transistor and a first NMOS pass transistor electrically coupled to one of the first pair of bit lines.

2. The memory device of claim 1, wherein at least one of the first PMOS pull-up transistor and the first NMOS pass transistor is a thin-film transistor.

3. The memory device of claim 1, wherein the first PMOS pull-up transistor is a PMOS thin-film transistor and the first NMOS pass transistor is an NMOS thin-film transistor.

4. The memory device of claim 3, wherein a first current carrying terminal of the PMOS thin-film transistor is electrically connected to a first current carrying terminal of the NMOS thin-film transistor and a true one of the first pair of bit lines.

5. The memory device of claim 4, wherein a gate terminal of the PMOS thin-film transistor is electrically connected to a gate terminal of the NMOS thin-film transistor.

6. The memory device of claim 5, wherein a second current carrying terminal of the PMOS thin-film transistor is electrically connected to a power supply line and a second current carrying terminal of the NMOS thin-film transistor is electrically connected to a global bit line.

7. An integrated circuit memory device, comprising:
first and second columns of memory cells electrically coupled to first and second pairs of bit lines, respectively;
a first bit line precharge and selection circuit comprising:
a stacked arrangement of a first PMOS thin-film transistor and a first NMOS thin-film transistor electrically coupled to a true one of the first pair of bit lines; and
a stacked arrangement of a second PMOS thin-film transistor and a second NMOS thin-film transistor electrically coupled to a complementary one of the first pair of bit lines; and
a pair of global bit lines electrically coupled to the first and second NMOS thin-film transistors.

8. The memory device of claim 7, further comprising:
a pair of data lines;
a precharge and equalization circuit electrically coupled to said pair of global bit lines; and
a global bit line selection circuit electrically coupled to said precharge and equalization circuit and said pair of data lines.

9. The memory device of claim 7, further comprising:
a second bit line precharge and selection circuit comprising:
a stacked arrangement of a third PMOS thin-film transistor and a third NMOS thin-film transistor electrically coupled to a true one of the second pair of bits lines; and
a stacked arrangement of a fourth PMOS thin-film transistor and a fourth NMOS thin-film transistor electrically coupled to a complementary one of the second pair of bit lines.

10. The memory device of claim 9, wherein said pair of global bit lines is electrically coupled to the third and fourth NMOS thin-film transistors.

11. The memory device of claim 10, further comprising:
a pair of data lines;
a precharge and equalization circuit electrically coupled to said pair of global bit lines; and
a global bit line selection circuit electrically coupled to said precharge and equalization circuit and said pair of data lines.

12. An integrated circuit memory device, comprising:
a first column of TFT SRAM cells electrically coupled to a first pair of bit lines; and
a bit line precharge and selection circuit comprising a stacked arrangement of a first PMOS TET and a first NMOS TFT electrically coupled to one of the first pair of bit lines.

13. The memory device of claim 12, wherein a first current carrying terminal of the PMOS TFT is electrically connected to a first current carrying terminal of the NMOS TFT and a true one of the first pair of bit lines.

14. The memory device of claim 13, wherein a gate terminal of the PMOS TFT is electrically connected to a gate terminal of the NMOS TFT.

15. The memory device of claim 14, wherein a second current carrying terminal of the PMOS TFT is electrically connected to a power supply line and a second current carrying terminal of the NMOS TFT is electrically connected to a global bit line.

16. A static random access memory (SRAM) device, comprising:
first and second columns of thin-film transistor (TFT) SRAM cells electrically coupled to first and second pairs of bit lines, respectively;

a first bit line precharge and selection circuit comprising:
  a stacked arrangement of a first PMOS TFT and a first NMOS TET electrically coupled to a true one of the first pair of bit lines; and
  a stacked arrangement of a second PMOS TFT and a second NMOS TFT electrically coupled to a complementary one of the first pair of bit lines; and
a pair of global bit lines electrically coupled to the first and second NMOS TFTs.

17. The SRAM device of claim 16, further comprising:
a pair of data lines;
a precharge and equalization circuit electrically coupled to said pair of global bit lines; and
a global bit line selection circuit electrically coupled to said precharge and equalization circuit and said pair of data lines.

18. The SRAM device of claim 16, further comprising:
a second bit line precharge and selection circuit comprising:
  a stacked arrangement of a third PMOS TET and a third NMOS TFT electrically coupled to a true one of the second pair of bits lines; and
  a stacked arrangement of a fourth PMOS TFT and a fourth NMOS TFT electrically coupled to a complementary one of the second pair of bit lines.

19. The SRAM device of claim 18, wherein said pair of global bit lines is electrically coupled to the third and fourth NMOS TFTs.

20. The SRAM device of claim 19, further comprising:
a pair of data lines;
a precharge and equalization circuit electrically coupled to said pair of global bit lines; and
a global bit line selection circuit electrically coupled to said precharge and equalization circuit and said pair of data lines.

21. The SRAM device of claim 16, wherein each of the TFT SRAM cells is a 6T cell comprising four TFT transistors stacked over two planar transistors, which are disposed within a semiconductor substrate.

22. The SRAM device of claim 21, wherein the four TFT transistors includes two TFT PMOS pull-up transistors and two TFT NMOS access transistors; and wherein the two planar transistors include two NMOS pull-down transistors.

* * * * *